United States Patent [19]
Inoue

[11] Patent Number: 6,160,628
[45] Date of Patent: Dec. 12, 2000

[54] INTERFEROMETER SYSTEM AND METHOD FOR LENS COLUMN ALIGNMENT

[75] Inventor: Fuyuhiko Inoue, San Mateo, Calif.

[73] Assignee: Nikon Corporation, Tokyo, Japan

[21] Appl. No.: 09/342,302

[22] Filed: Jun. 29, 1999

[51] Int. Cl.[7] .................................................. G01B 9/02
[52] U.S. Cl. ........................................ 356/500; 356/508
[58] Field of Search ................................... 356/349, 351, 356/358, 363; 355/53

[56] References Cited

U.S. PATENT DOCUMENTS

| | | |
|---|---|---|
| 4,772,119 | 9/1988 | Bouwhuis et al. . |
| 4,985,634 | 1/1991 | Stengl et al. . |
| 5,032,026 | 7/1991 | Jouve et al. . |
| 5,151,749 | 9/1992 | Tanimoto et al. ................. 356/363 |
| 5,184,176 | 2/1993 | Unno et al. . |
| 5,270,771 | 12/1993 | Sato . |
| 5,473,410 | 12/1995 | Nishi ................................ 355/53 |
| 5,716,742 | 2/1998 | Doran . |
| 5,723,238 | 3/1998 | Moore et al. . |
| 5,764,361 | 6/1998 | Kato et al. ....................... 356/358 |

Primary Examiner—Samuel A. Turner
Attorney, Agent, or Firm—Finnegan Henderson Farabow Garrett & Dunner, L.L.P.

[57] ABSTRACT

A projection exposure apparatus and method aligns a substrate with an optical axis of a lens column using one or more interferometers, mirrors, and a control device. The lens column projects a pattern from a mask onto the substrate. The optical axis of the lens column is perpendicular to the substrate. To ensure precise alignment of the lens column and the substrate, the one or more interferometers use a plurality of beams having respective paths, the lengths of which change in response to movement of the optical axis. In response to the detected changes of the interferometer beams, a control device adjusts the position of the stage so that the substrate is aligned with the optical axis of the lens column.

28 Claims, 9 Drawing Sheets

INTERFEROMETER SYSTEM AND METHOD FOR LENS COLUMN ALIGNMENT

BACKGROUND OF THE INVENTION

A. Field of the Invention

The present invention relates generally to a projection exposure system for transferring an image of a pattern onto a substrate, such as a semiconductor wafer. More particularly, the present invention relates to a projection exposure apparatus and method that provides enhanced precision in the alignment of a projection optical system and the substrate.

B. Description of the Prior Art

Semiconductor fabrication requires precise alignment of an optical system with a substrate in order to produce extremely detailed circuitry on the substrate. FIG. 1 illustrates a conventional projection exposure apparatus 10, which includes a light source 12, a stage 14, a lens column 16, a mask 18, and an interferometer 20. Light source 12 illuminates mask 18, causing a pattern from the mask to be projected through lens column 16. Lens column 16 projects the pattern onto a photosensitive substrate on stage 14. The optical axis of lens column 16 is indicated by the broken line down the middle of lens column 16.

Exposure of the pattern onto the substrate requires moving stage 14 to provide accurate alignment between the substrate and lens column 16. The optical axis of lens column 16 cannot be directly measured without disturbing the projection of the image of the pattern to stage 14. Therefore, in conventional systems, interferometer 20 detects alignment by projecting a first light beam 21 to a mirror on side 24 of lens column 16, and a second light beam 22 to a corresponding side 26 of stage 14. Each beam is reflected back through a beam splitter to a control device. As the beams travel back through the beam splitter they interfere with each other. Using the interference information, the control device determines the alignment between the optical axis and the substrate on stage 14. In response to the alignment determination, the position of stage 14 is adjusted in relation to lens column 16 to align the substrate on stage 14 with lens column 16.

Charges in beam 21, however, may not provide accurate information for alignment because of the sensitivity of lens column 16 to thermal expansion and displacement. Fluctuations in the air temperature may result in expansion of lens column 16, as generally illustrated in FIG. 2. Note that an even expansion (or contraction) of both sides does not displace the optical axis. FIG. 3 illustrates shifting of lens column 16. Shifting of lens column 16 results in the same reading from beam 21 as is received in FIG. 2 even though the optical axis in FIG. 2 has not shifted. Therefore, an adjustment of stage 14 based on the interferometer readings in FIG. 2 will result in an inaccurate alignment of stage 14 and lens column 16. Accordingly, errors arise in the exposure of stage 14 to the image of the pattern projected through lens column 16. More particularly, because conventional alignment procedures use only one side of lens column 16, all of the alignment problems are not properly detected. Accordingly, the adjustment of stage 14 in relation to lens column 16 is often inaccurate and, as such, results in errors in the projection of the image of the pattern onto the substrate on stage 14.

Further still, lens column 16 may be sensitive to vibrations in the projection exposure apparatus. Typically, adjusting stage 14 results in vibration throughout the projection exposure apparatus. This vibration may result in fluctuations of lens column 16, as generally illustrated in FIG. 3. Because of the fluctuations, the precise alignment of lens column 16 may no longer be attainable from the conventional alignment procedure. Accordingly, adjustment of stage 14 in relation to lens column 16 is often inaccurate and results in errors in the projection of the image of the pattern onto the substrate on stage 14.

Although these inaccuracies of conventional alignment procedures may be tolerable for the level of precision required under certain semiconductor manufacturing design constraints, the precision required in modern semiconductor manufacturing processes requires a reduction in or elimination of these inaccuracies. To attain such precision, errors caused by thermal deformation, displacement, and vibration in lens column 16 must be substantially eliminated.

Therefore, there is a need for a projection exposure apparatus and method that can substantially reduce inaccuracies in the alignment of the lens and the stage.

SUMMARY OF THE INVENTION

The advantages and purpose of the invention will be set forth in part in the description which follows, and in part will be obvious from the description, or may be learned by practice of the invention. The advantages and purpose of the invention will be realized and attained by means of the elements and combinations particularly pointed out in the appended claims.

To attain the advantages and in accordance with the purpose of the invention, as embodied and broadly described herein, the projection exposure apparatus of the present invention includes a projection optical system, one or more interferometers, and a control device. To align the lens column and the substrate, the one or more interferometers pass a plurality of beams having respective paths that travel to respective first and second sides of the lens column, thus detecting true shifts in the optical axis. In response to the beams, the control device adjusts the position of the stage so that the substrate on the stage is properly aligned with the optical axis of the lens column.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate preferred embodiments of the invention and, together with the description, serve to explain the principles of the invention. In the drawings.

DESCRIPTION OF THE PREFERRED EMBODIMENT(S)

Reference will now be made in detail to an embodiment of the invention, examples of which are illustrated in the accompanying drawings.

In accordance with the invention, there is provided a projection exposure apparatus and method for transferring an image of a pattern formed on a mask through a lens column along an optical axis perpendicular to a substrate, onto the substrate. Precise alignment of the substrate with the optical axis is achieved by the present invention, which detects proper alignment using one or more interferometers that pass at least one beam of light to an opposite side of the lens column.

The projection exposure apparatus of the present invention includes a projection optical system, one or more interferometers, and a control device. The one or more interferometers are oriented such that a plurality of beams are created. Each beam has a respective path, the length of which changes in response to a change in a dimension of the lens column along the path of the beam. The beams are reflected back to a control device which receives the beams, determines the changes in a dimensions of the lens column, and adjusts the stage on which the substrate is positioned so that a particular area of the substrate is aligned with the optical axis of the lens column.

Figure 1:
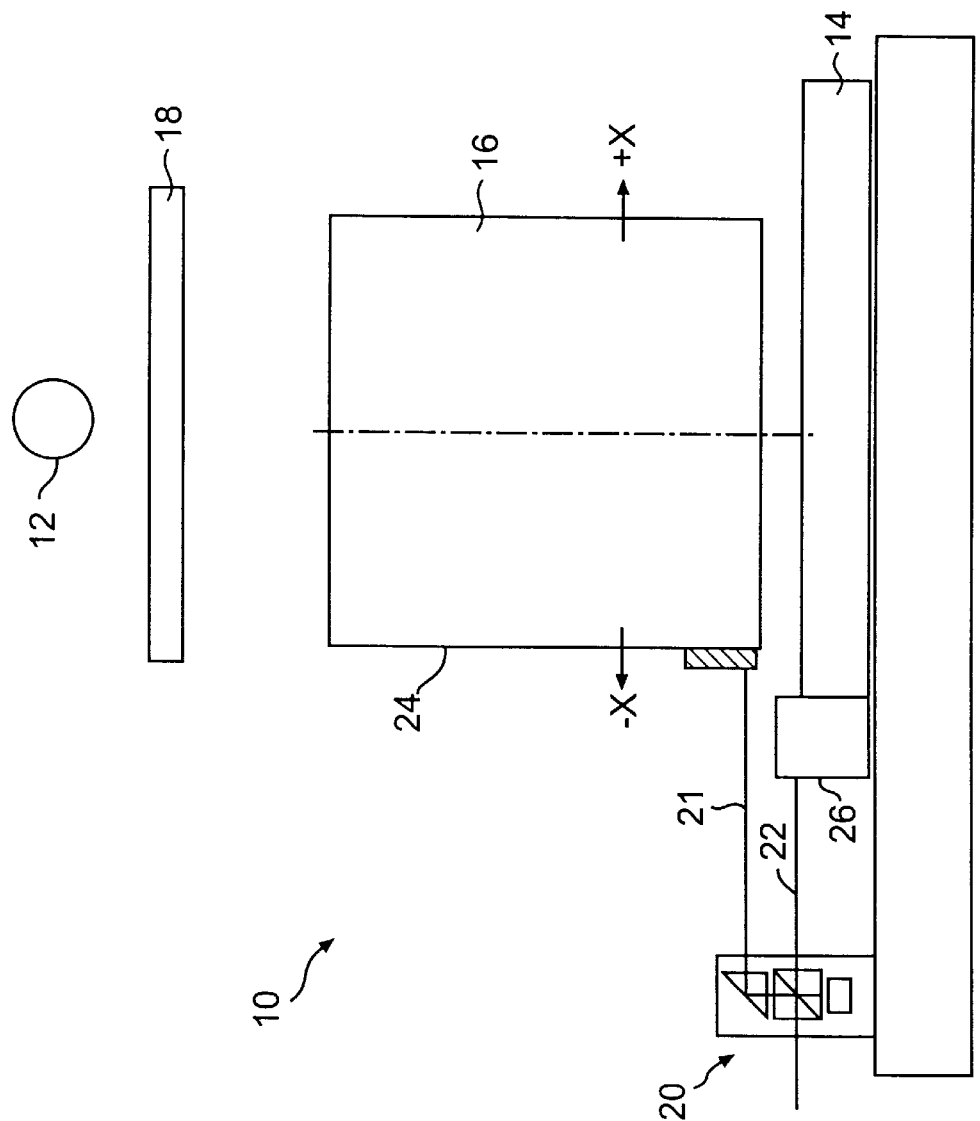
FIG. 1 is a side view of a conventional projection exposure apparatus.
Figure 2:
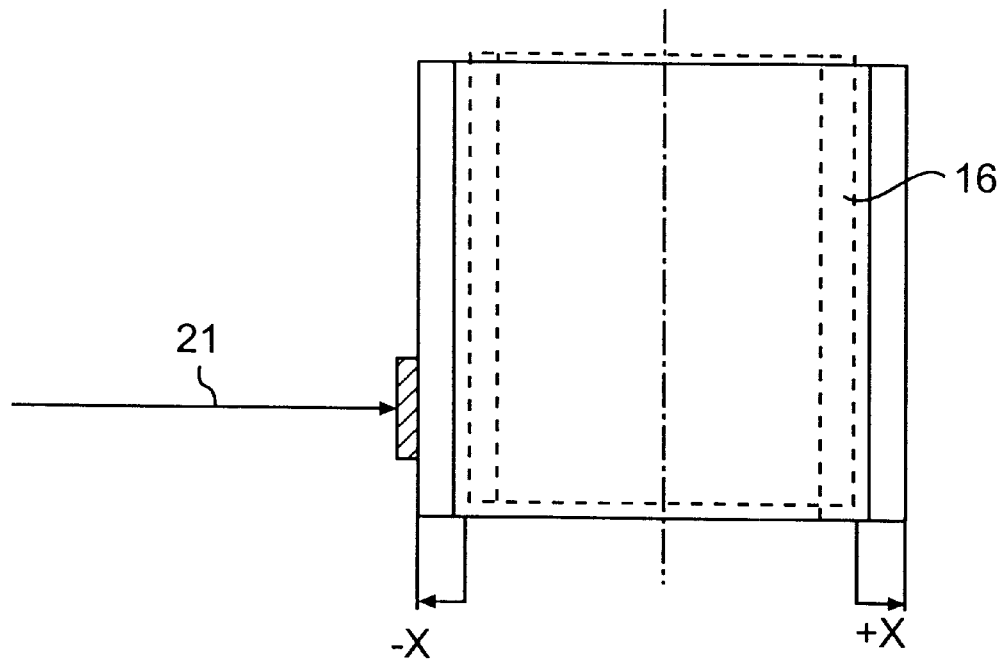
FIG. 2 shows thermal expansion of the projection optical system in a direction perpendicular to an optical axis.
Figure 3:
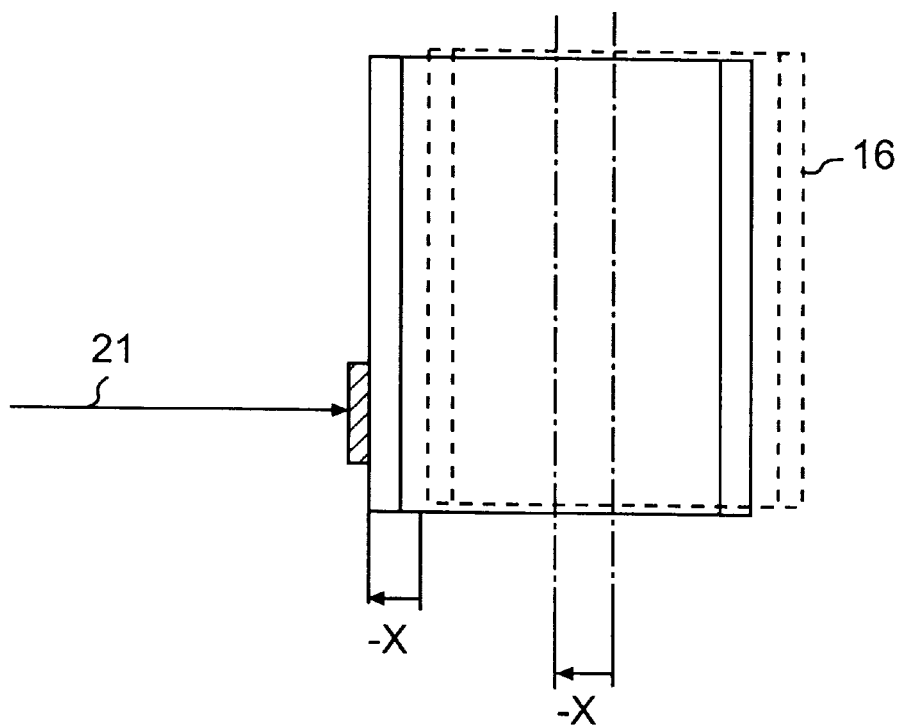
FIG. 3 shows displacement of the projection optical system in a direction perpendicular to an optical axis.
Figure 4:
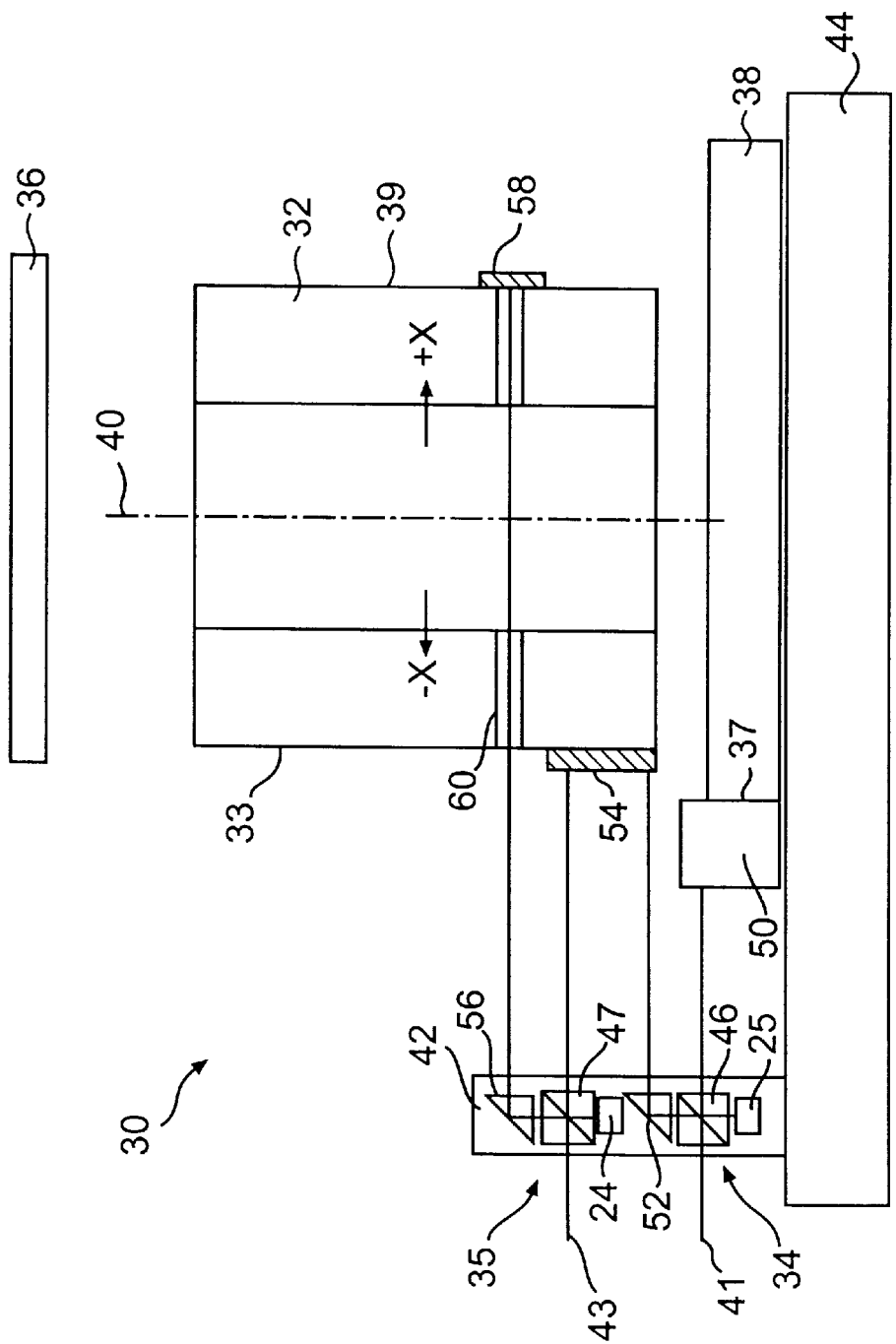
FIG. 4 is a side view of one embodiment of a projection exposure apparatus consistent with the present invention.

FIG. 4 is a block diagram showing one embodiment of projection exposure apparatus 30 consistent with the principles of the invention. Projection exposure apparatus 30 includes lens column 32, mask 36, stage 38 and interferometers 34 and 35. Lens column 32 projects an image of a pattern from mask 36 onto a substrate on stage 38. The broken line down the center of lens column 32 is optical axis 40. The present invention ensures precise alignment of a substrate on stage 38 with lens column 32 by properly detecting inaccuracies introduced by thermal expansion, displacement, and vibration of lens column 32 and adjusting stage 38 accordingly.

Interferometers 34 and 35 are positioned on mount 42. Stage 38 is positioned at the other end of base 44. In one embodiment, each interferometer 34 and 35 includes a separate light source, preferably a laser beam, and projects beams to beam splitters 46 and 47, respectively. Interferometer 34 projects laser beam 41 to beam splitter 46. Beam splitter 46 splits the beam and projects a first beam to first reflective surface 50 positioned proximate to side 37 of stage 38, and a second beam to mirror 52. Mirror 52 then deflects the second beam to reflective surface 54 positioned proximate to side 33 of lens column 32.

Interferometer 35 projects laser beam 43 to beam splitter 47. Beam splitter 47 splits the beam and projects a first beam to second reflective surface 54 positioned proximate to side 33 of lens column 32, and a second beam to mirror 56. Mirror 56 deflects the second beam to third reflective surface 58 positioned proximate to side 39 of lens column 32. Lens column 32 includes tunnel 60 which allows the second beam to travel through lens column 32 to third reflective surface 58. Tunnel 60 is oriented substantially parallel to the image plane. In one embodiment, lens column 32 includes a plurality of lenses, and tunnel 60 is disposed in a space between adjacent lenses.

The beams created by beam splitter 47 are reflected back by second reflective surface 54 and third reflective surface 58 and detected by detector 24. Detector 24 determines changes in the beam lengths by the interference of the beams. Similarly, detector 25 determines changes in the beam lengths of the beams created by beam splitter 46. Based on the changes in beam length detected by detectors 24 and 25, a control device (not shown) moves stage 38 to align the substrate on stage 38 with lens column 32. Movement of stage 38 is well-understood in the art and will not be detailed here.

The beams from interferometers 34 and 35 allow measurement of displacement of each side of the lens column 32 in a direction perpendicular to optical axis 40, which allows determination of alignment of lens column 32 in relation to stage 38 in the direction perpendicular to optical axis 40. From the output of interferometer 35, movement of optical axis 40 may be obtained with a high degree of precision because changes in the dimensions of lens column 32 in the direction perpendicular to optical axis 40 can be detected and compensated for if necessary.

A similar configuration of interferometers 34 and 35, first reflective surface 50, and second reflective surface 54 and third reflective surface 58, is replicated for determining similar fluctuations of lens column 32 in a direction perpendicular to the fluctuations detected in FIG. 4. That is, whereas the configuration of elements in FIG. 4 detects fluctuations of lens column 32 in the left and right direction, additional elements are used to detect fluctuations of lens column 32 in a direction perpendicular to left and right.

Figure 5:
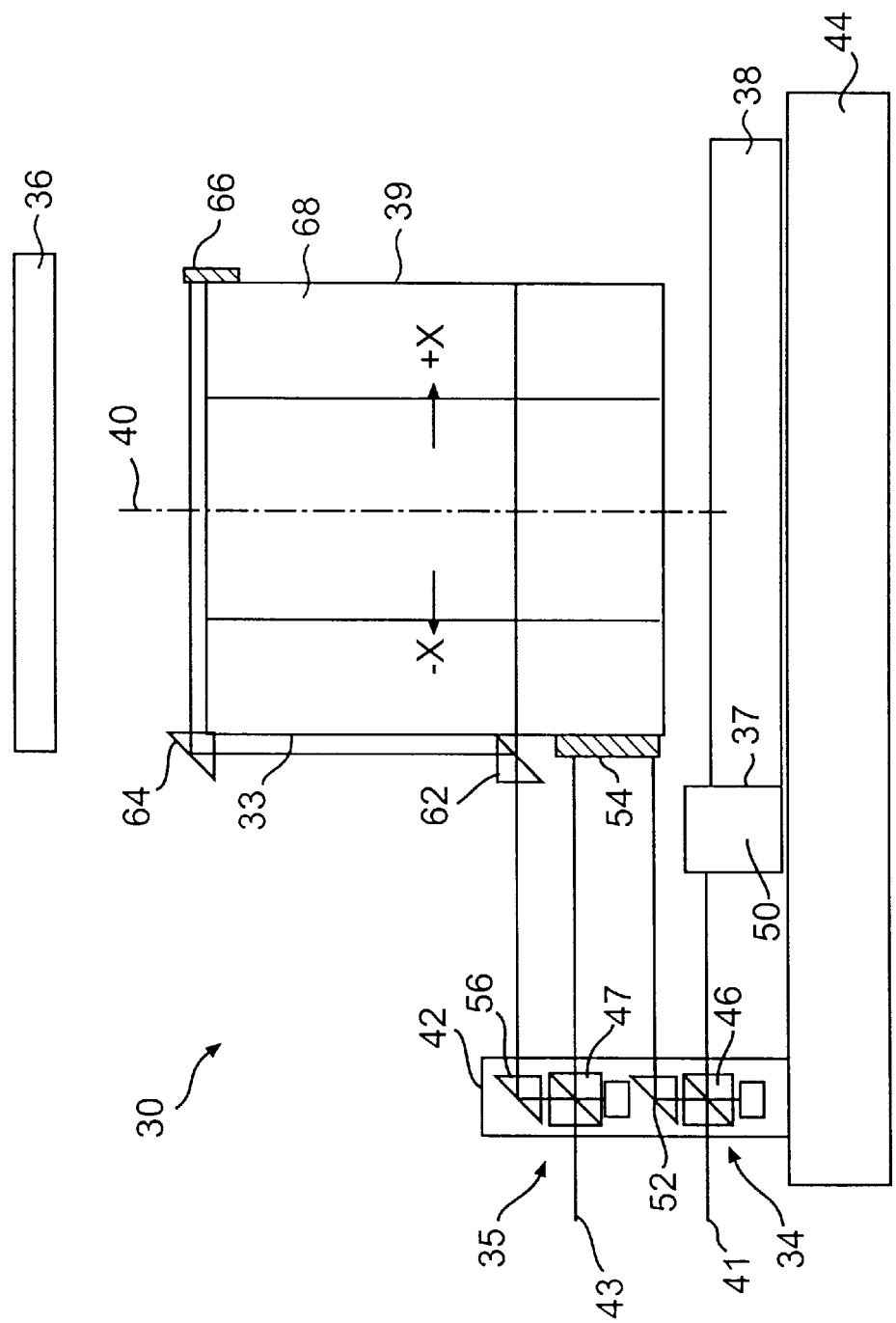
FIG. 5 is a side view of another embodiment of a projection exposure apparatus consistent with the present invention.
Figure 6:
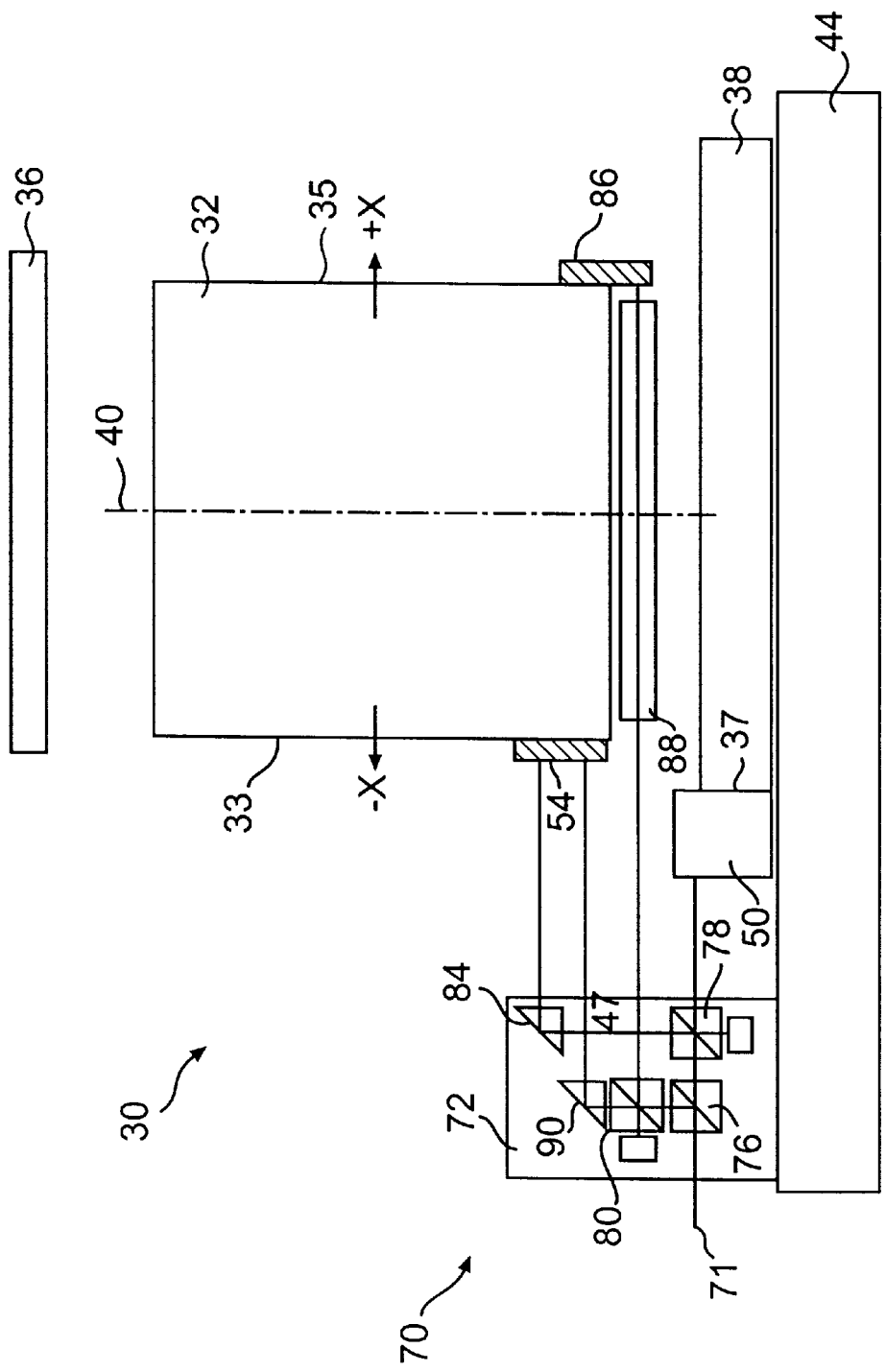
FIG. 6 is a side view of yet another embodiment of a projection exposure apparatus consistent with the present invention.

FIGS. 5 and 6 illustrate an embodiment wherein placement of reflective surfaces requires a beam to travel around, rather than through, lens column 32. The output of interferometer 34 provides the location of the corresponding sides of the stage and the projection optical system with respect to one another with a high degree of precision.

Using the information from interferometers 34 and 35, stage 38 is adjusted so that optical axis 40 and the substrate on stage 38 are properly aligned. Once aligned, projection exposure apparatus 30 may accurately transfer the pattern on mask 36 onto the substrate of stage 38. Accordingly, the alignment of optical axis 40 to a particular area of a substrate on stage 38 enhances the precision of the exposure of the substrate.

FIG. 5 illustrates one variation of the projection exposure apparatus consistent with the invention. The projection exposure apparatus of FIG. 5 is similar to the exposure apparatus of FIG. 4. In contrast to the projection exposure apparatus 30 of FIG. 4, lens column 68 does not include a tunnel, and thus the beams are routed differently than in FIG. 4. Interferometer 35 is configured so that one beam projects to side 39 of lens column 68. To accomplish this, interferometer 35 projects laser beam 43 to beam splitter 47. Beam splitter 47 splits the beam and projects a first beam to second reflective surface 54 positioned proximate to side 33 of lens column 68 and a second beam to mirror 56. Mirror 56 deflects the second beam to mirror 62 positioned proximate to side 33 of lens column 68. Mirror 62 deflects the beam to mirror 64 positioned proximate to a corner of side 33 of lens column 68. Finally, mirror 64 projects the second beam to third reflective surface 66 positioned proximate to side 39 of lens column 68. Thus, interferometer 35 provides a measurement of the dimension of lens column 68 in the direction perpendicular to optical axis 40. The output of interferometer 35 provides the position of optical axis 40 of lens column 68 with a high degree of precision. Also, the output of interferometer 34 provides the position of stage 38 in relation to lens column 68. Using these measurements, the position of stage 38 may be appropriately adjusted, thus resulting in the precise alignment of optical axis 40 with a particular area of a substrate on stage 38.

Although FIG. 5 shows the beam traversing over the top of lens column 68, interferometer 35 and mirrors 62, 64 and 66 could be arranged so that the beam traverses around the bottom of projection optical system 68. Furthermore, similar to FIG. 4, there is another set of interferometers and mirrors which measure fluctuation in a direction perpendicular to the fluctuations measured by the elements shown in FIG. 5.

FIG. 6 illustrates another embodiment of the projection exposure apparatus of the present invention wherein only one interferometer 70 is used for measuring the dimension of lens column 32 in a direction perpendicular to optical axis 40, as well as the alignment of lens column 32 in relation to stage 38 in the direction perpendicular to optical axis 40. Interferometer 70 is positioned on mount 72. Mount 72 and stage 38 reside on base 44.

Interferometer 70 projects laser beam 71 to first beam splitter 76. Beam splitter 76 splits the beam and projects a first beam to second beam splitter 78 and a second beam to third beam splitter 80. Second beam splitter 78 splits the first beam and projects a beam to first reflective surface 50 positioned proximate to side 37 of stage 38 and a beam to mirror 84 positioned on mount 72. Mirror 84 deflects the beam to second reflective surface 54 positioned proximate to side 33 of lens column 32. Third beam splitter 80 splits the second beam and projects one beam to third reflective surface 86 positioned proximate to side 35 of lens column 32 and another beam to mirror 90 positioned on mount 72. The beam projects to third reflective surface 86 by traversing through lens 88 of lens column 32. Mirror 90 deflects the beam to second reflective surface 54 positioned proximate to side 33 of lens column 32. This embodiment may be used in situations where there is insufficient space between adjacent lenses of lens column 32 to position a tunnel.

Interferometer 70 provides the beams for measurement of the dimensions of lens column 32 in a direction perpendicular to optical axis 40, and alignment of lens column 32 in relation to stage 38 in the direction perpendicular to optical axis 40. From the output of interferometer 70, the location of optical axis 40 of lens column 32 and the location of stage 38 in relation to lens column 32 may be determined with a high degree of precision. By using measurements from the reflected beams, stage 38 may be appropriately adjusted, thus resulting in the precise alignment of optical axis 40 and the substrate on stage 38.

A second set of elements (not shown) is also included to perform similar measurements of fluctuations perpendicular to the fluctuations measured by the elements of FIG. 6.

Figure 7A:
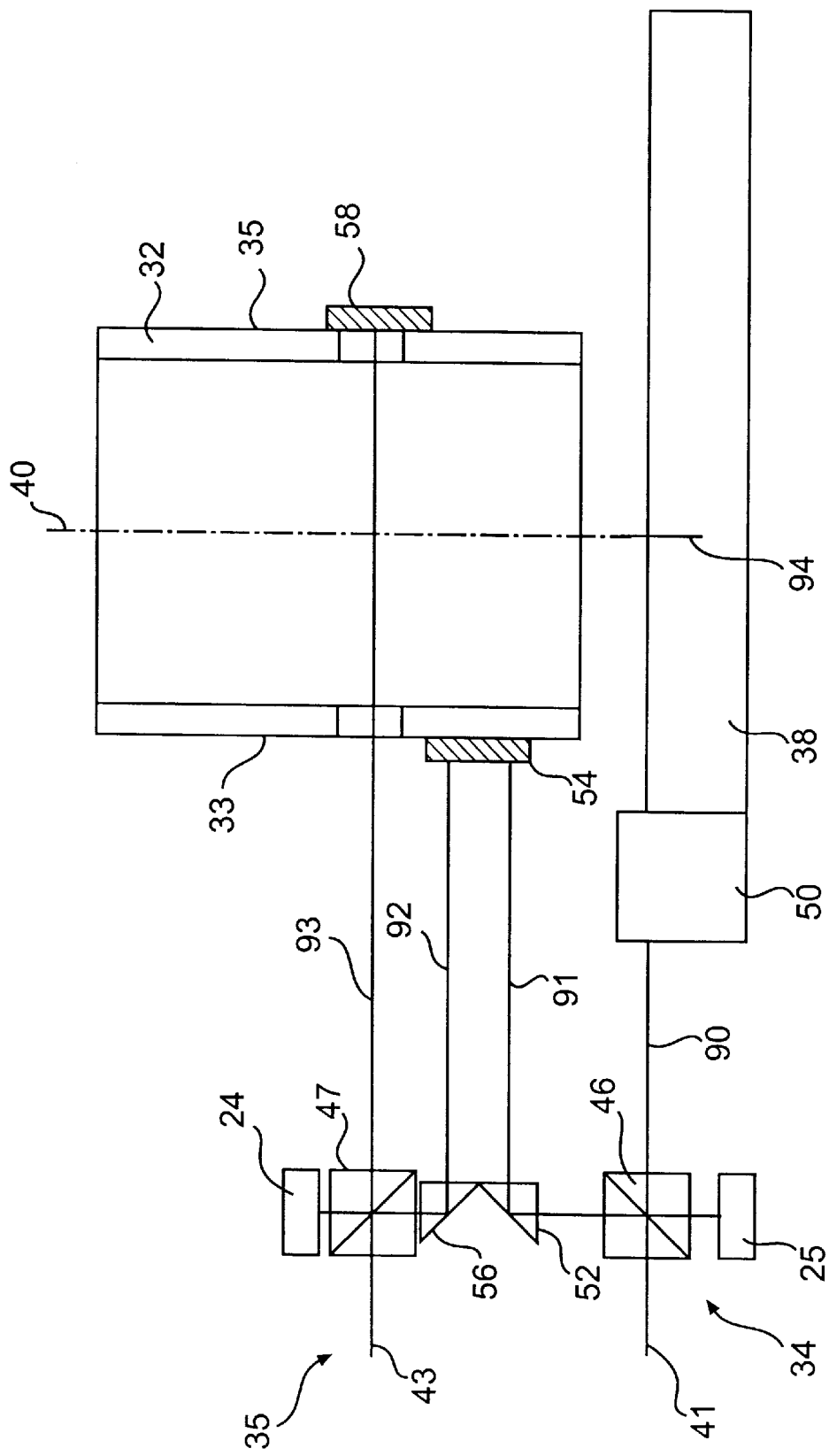
FIG. 7(a) is a block diagram illustrating detection of deformation utilizing beams passing through the projection optical system, similar to the technique illustrated in FIG. 4.

FIG. 7(a) is a block diagram illustrating detection of deformation utilizing beams passing through the projection optical system, similar to the technique illustrated in FIG. 4. More particularly, in the embodiment shown in FIG. 7(a), two beams are used. A first beam 92 is reflected off of a second reflective surface 54 on the left side 33 of the lens column 32. A second beam 93 is reflected through lens column 32 to a third reflective surface 58 on the right side 35 of lens column 32, and back through the opening 60 on the left side 33 of lens column 32. Using measurements from beams 92 and 93, it can be determined whether the deformation of the lens column 32 has had any impact on the optical axis, and whether adjustments need to be made. Note that conventional systems take interferometer readings from a single reflective surface on the side of the projection optical axis which no shift actually took place.

Interferometer system 34 is utilized for aligning stage 38 position. Since interferometer system 34 measures and detects the difference between the length of reference axis 91 and axis 90, stage position can be measured if reference axis is stable. When optical axis 40 is aligned with a target 94 on stage 38, the difference between the length of axis 91 and of axis 90 that can be measured by interferometer system is defined as: Length of axis 90−Length of axis 91=A.

Figure 7B:
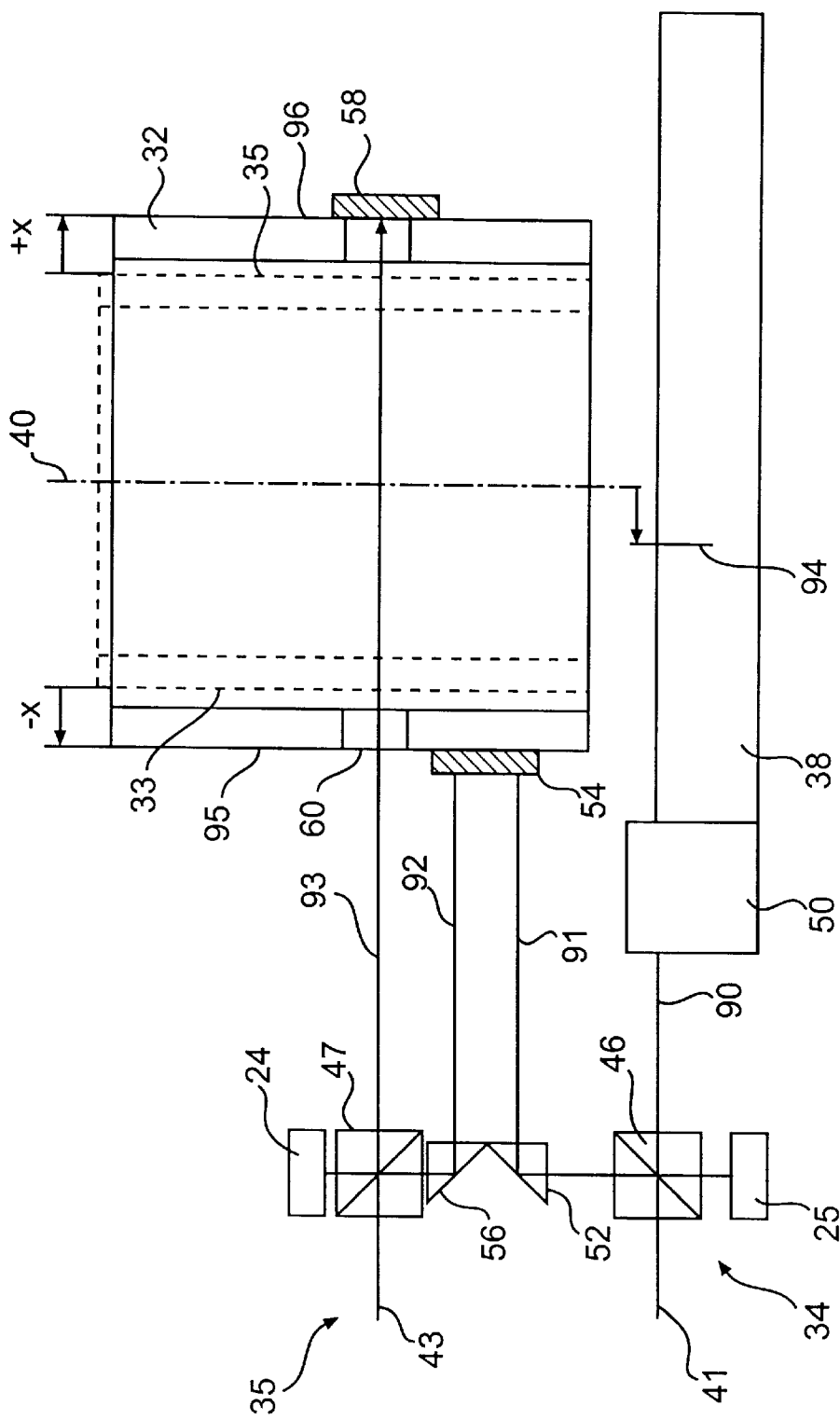
FIG. 7(b) shows the expansion of 1 lens column 32 by x.

FIG. 7(b) shows the expansion of 1 lens column 32 by x. The left wall 95 of lens column 32 shifts x because of lens column expansion. The reference axis length becomes shorter by x. Thus, Length of axis 90−Length of axis 91=A+x. As the stage controller corrects for x by moving stage 30, stage 38 moves x to left. Since optical axis 40, however, does not move in response to lens expansion, target 94 shifts a distance x from optical axis 40. Using interferometer system 35, x can be measured. If lens column 32 expands x, the length of 92 becomes shorter by x, and the length of 93 becomes longer by x. Thus, the difference between the length of 92 and the length of 93 changes 2x. The interferometer system 35 can measure this change of 2x, and interferometer system 34 can respond properly.

Figure 8:
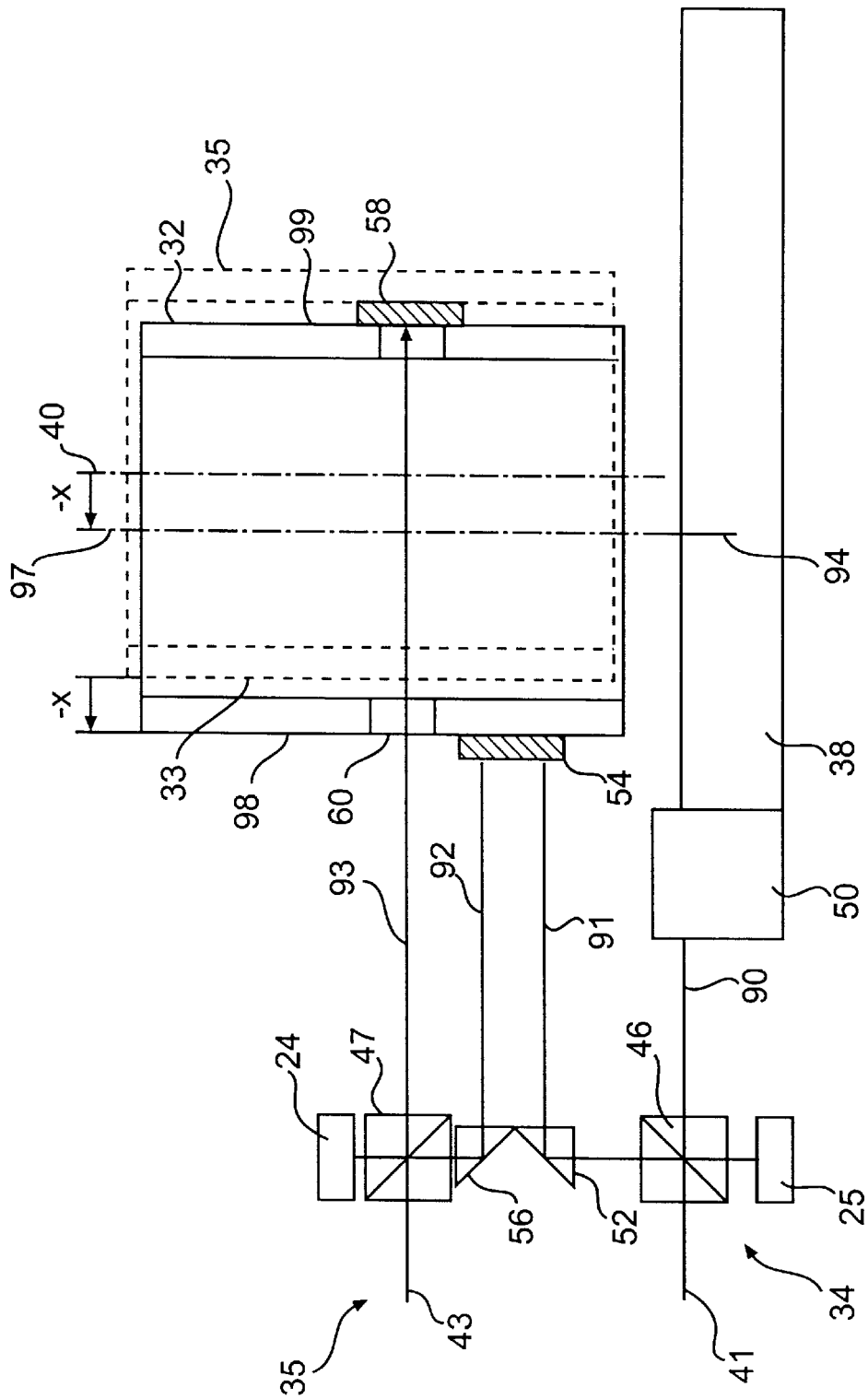
FIG. 8 illustrates lens displacement.

FIG. 8 illustrates lens displacement. The left wall 98 of lens column 32 shifts x because of lens column displacement. Thus, the reference axis length becomes shorter by distance x: Length of axis 90−Length of axis 91=A+x. As the stage controller corrects for x by moving stage 38, stage 30 moves by distance x to left. In the case of displacement, since optical axis 40 also moves by lens displacement, target 94 keeps the same position as optical axis 40. If lens column 32 shifts by x, the length of 92 becomes shorter by x, and the length of axis 93 also becomes shorter by x. The difference between the length of 92 and the length of 93 does not change. The detection by interferometer system 35 does not affect the result of interferometer system 34. Thus, lens expansion that could not be distinguished with lens displacement can be measured by utilizing the interferometer system 35 and can be corrected.

Figure 9:
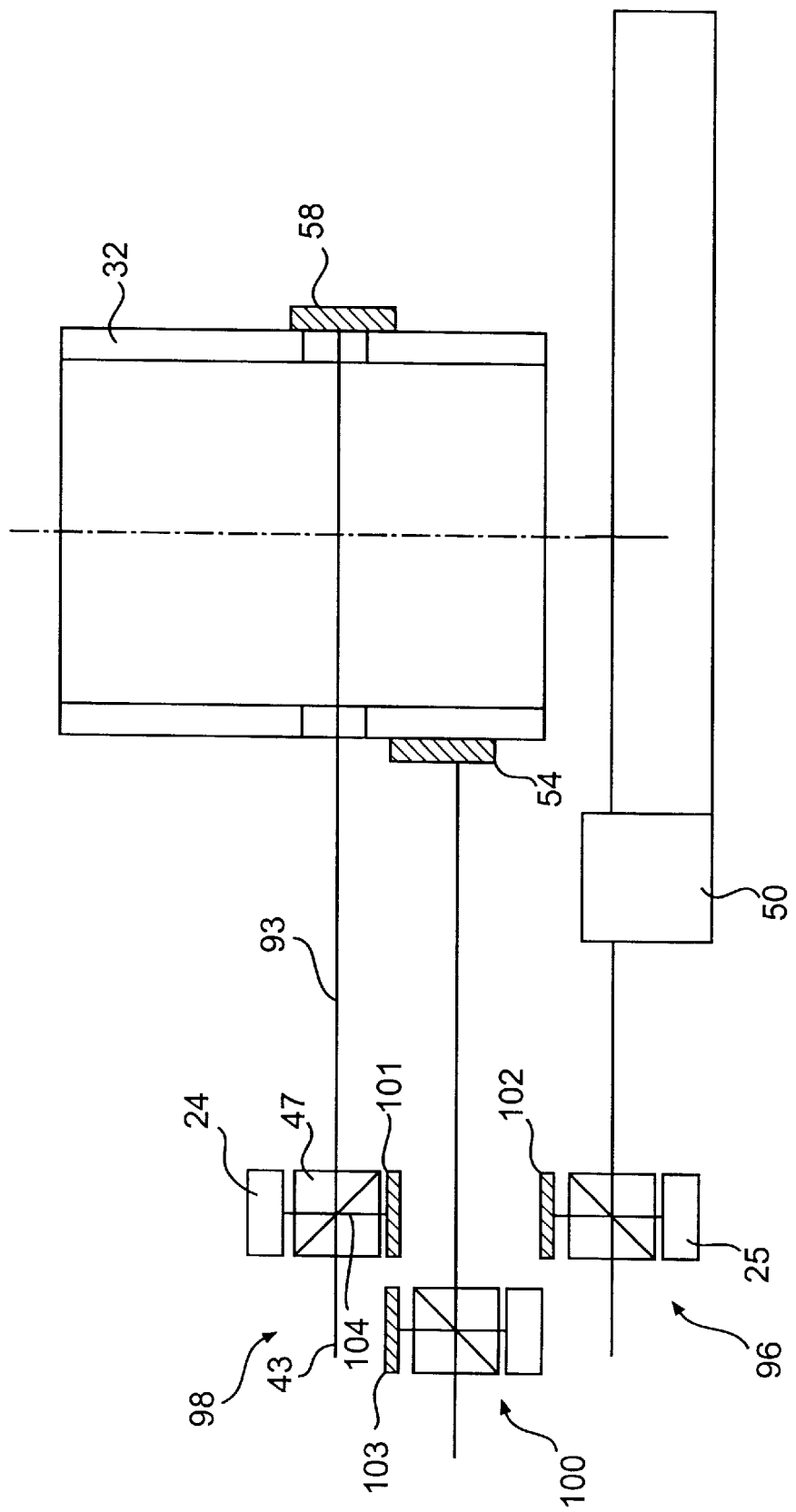
FIG. 9 illustrates replacing the interferometer system 34 and 35 of FIG. 8 with the interferometer system 96, 98, and 100.

FIG. 9 illustrates replacing the interferometer system 34 and 35 of FIG. 8 with the interferometer system 96, 98, and 100. In FIG. 9, each interferometer system is called absolute type. The system 98 has beam 43, beam splitter 47, detector 24 and reference mirror 101 instead of second reflective surface 54. This system measures the difference between the length of 93 and the length of 101. Thus, system 98 measures the position of third reflective surface 58. In the same way, system 96 measures the position of first reflective surface 50 (stage) and system 100 measures the position of second reflective surface 54. The relationship between stage position and lens column 32 can be calculated electrically as: Result of system 96−Result of system 100. Lens expansion can be calculated electrically as: Result of system 98−Result of system 100. Thus, this system can provide a result similar to that of the system shown in FIG. 7(a).

It will be apparent to those skilled in the art that various modifications and variations can be made in the exposure of the present invention without departing from the scope or spirit of the invention. For example, although the systems and methods described include one or two interferometers for detecting movement of the optical axis in a particular direction, the projection exposure apparatus may include any number of interferometers, and the positions of the interferometers are not limited as shown. In addition, the system may include alternative configurations of mirrors. Furthermore, the one or more interferometers may measure the dimension of the projection optical system in a dimension perpendicular to the optical axis at multiple locations of the projection optical system.

The invention is not limited to use as an apparatus or method for the exposure of a mask pattern onto a substrate. The apparatus and method for detecting alignment error described consistent with the invention may be employed in any system requiring a high degree of accuracy and in which external factors may influence alignment.

Furthermore, the exposure system in the present embodiment can also be applied to a scanning-type exposure system (See, e.g., U.S. Pat. No. 5,473,410), where a mask and a wafer are moving synchronously to expose a mask pattern.

In addition, the exposure system in the present embodiment can be applied to a step-and-repeat type exposure system, where a mask pattern is exposed while the mask and the wafer are stationary, and the wafer is stepped and moved in succession.

In addition, the invention may also be applied to a proximity exposure system, where a mask pattern is exposed by closely placing the mask and the wafer, without using projection optics.

The use of the exposure system does not need to be limited to semiconductor manufacturing. For example, it can be used in an LCD exposure system, where an LCD pattern is exposed onto a rectangular glass plate, or an exposure system for manufacturing a thin film magnetic head.

With respect to the light source for the exposure system, the g-line (436 nm), i-line (365 nm), KrF excimer laser (248 nm), ArF excimer laser (193 nm), and the F2 laser (157 nm) may be used, as well as charged particle beams such as the x-ray and electron beams. If an electron beam is used, thermionic emission type lanthanum hexaboride ($LaB_6$) or tantalum (Ta) can be used as an electron gun. Furthermore, when an electron beam is used, the structure could use a mask, or it could be structured such that a pattern can be formed directly onto a wafer without using a mask.

The magnification of the projection optical system does not have to be limited to a reduction system. For example, it could be 1x or a magnification system as well.

With respect to the projection optical system, when far ultra-violet rays such as the excimer laser is used, glass materials that transmit far ultra-violet rays such as quartz and fluorite should be used. When the F2 laser or the x-ray is used, the optical system should be either catadioptric or refractive (the reticle should be a reflective type). Finally, when an electron beam is used, electron optics should consist of electron lenses and deflectors. Needless to say, the optical path for electron beams should be in vacuum.

When linear motors (See, e.g., U.S. Pat. No. 5,623,853 or U.S. Pat. No. 5,528,118) are used in a wafer stage or a reticle stage, they may be any of a variety of available linear motors, such as the air levitation type using air bearings or the magnetic levitation type using the Lorentz force or reactance force. In addition, the stage could move along a guide, or it could be a guideless type where no guide is installed.

The stage drive system may be implemental using a planar motor which drives the stage by electromagnetic force, in which a magnet unit having magnets arranged two-dimensionally and an armature coil unit having coils arranged two-dimensionally are facing with each other, can be used. In this case, either one of the magnet unit or the armature coil should be connected to the stage, and the other should be mounted on the moving plane side of the stage.

Reaction force generated by the wafer stage motion can be mechanically released to the floor (ground) by using a frame member, as described in JP Hei 8-166475 published patent (U.S. Pat. No. 5,528,118).

Reaction force generated by the reticle stage motion can be mechanically released to the floor (ground) by using a frame member, as described in JP Hei 8-330224 published patent (U.S. Ser. No. 08/416,558).

As described above, an exposure system consistent with the principles of the present invention can be built by assembling various subsystems, including the elements listed in the claims of the present application, in such a manner that the prescribed mechanical accuracy, electrical accuracy and optical accuracy are maintained. To maintain accuracy of various subsystems, every optical system is adjusted to achieve its optical accuracy, every mechanical system is adjusted to achieve its mechanical accuracy, and every electrical system is adjusted to achieve its electrical accuracy before and after its assembly. The process of assembling each subsystem into an exposure system includes mechanical interfaces, electrical circuits wiring connections and air pressure plumbing connections. Each subsystem is assembled prior to assembling the exposure system from various subsystems. Once the exposure system is assembled with various subsystems, overall adjustment is performed so as to ensure that every accuracy is maintained in the total system. Incidentally, it is desirable to manufacture an exposure system in a clean room where the temperature and the cleanliness are controlled. Conventional semiconductor devices are fabricated by going through the following steps: the device's function and performance are designed; a reticle is designed according to the previous designing step; a wafer is made from a silicon material; a pattern from the reticle is exposed on a wafer by the exposure system in the aforementioned apparatus and methods consistent with the principles of the invention; the device is assembled (including the dic6ing process, bonding process and packaging process); and the inspection step, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for detecting alignment between a first member and a second member, comprising:

means for detecting a first measuring beam reflected from a first reflecting surface located proximate a first side of the first member and a second measuring beam reflected from a second reflecting surface located proximate a second side different from the first side of the first member;

means for detecting a third measuring beam reflected from the first reflecting surface and a fourth measuring beam reflected from a third reflecting surface located proximate a first side of the second member; and means for determining alignment between the first member and the second member based on the first through fourth measuring beams.

2. The apparatus according to claim 1, further comprising:
means for splitting a first source beam to form the first and second measuring beams.

3. The apparatus according to claim 2, further comprising:
means for splitting a second source beam to form the third and fourth measuring beams.

4. The apparatus according to claim 1, wherein the first member has a path through which the second measuring beam passes.

5. The apparatus according to claim 1, further comprising:
a fourth reflecting surface located proximate the first side of the first member for reflecting the second beam; and
a fifth reflecting surface located proximate to the first side of the first member for reflecting the second beam between the fourth reflecting surface and the second reflecting surface.

6. The apparatus according to claim 1, further comprising:
means for providing a source beam;
means for splitting the source beam into first and second initial beams;
means for splitting the first initial beam into the first and second measuring beams; and
means for splitting the second initial beam into the third and fourth measuring beams.

7. The apparatus according to claim 1, further comprising:
a lens through which the second beam is passed.

8. A lithography system comprising the apparatus of claim 1.

9. A method of determining alignment between a first member and a second member, comprising:
detecting a first measuring beam reflected from a first reflecting surface located proximate a first side of the first member and a second measuring beam reflected from a second reflecting surface located proximate a second side opposite the first side of the first member;
detecting a third measuring beam reflected from the first reflecting surface and a fourth measuring beam reflected from a third reflecting surface located proximate a first side of the second member; and
determining alignment between the first member and second member based on the result of detecting the first through fourth measuring beams.

10. The method according to claim 9, further comprising:
splitting a first source beam to form the first and second measuring beams.

11. The method according to claim 10, further comprising:
splitting a second source beam to form the third and fourth measuring beams.

12. The method according to claim 9, wherein the first member has a path through which the second measuring beam passes.

13. The method according to claim 9, further comprising:
reflecting the second measuring beam from a fourth reflecting surface located proximate the first side of the first member; and
reflecting the second measuring beam between the fourth reflecting surface and the second reflecting surface by a fifth reflecting surface.

14. The method according to claim 9, further comprising:
providing a source beam;
splitting the source beam into first and second initial beams;
splitting the first initial beam into the first and second measuring beams; and
splitting the second initial beam into the third and fourth measuring beams.

15. The method according to claim 9, further comprising:
passing the second measuring beam through a lens.

16. An apparatus for detecting alignment between a first member and a second member, comprising:
a first detector to detect a first measuring beam reflected from a first reflecting surface located proximate a first side of the first member and a second measuring beam reflected from second reflecting surface located proximate a second side different from the first side of the first member;
a second detector to detect a third measuring beam reflected from the first reflecting surface and a fourth measuring beam reflected from a third reflecting surface located proximate a first side of the second member; and
a determiner to determine alignment between the first member and second member based on the results of the first detector and the second detector.

17. The apparatus according to claim 16, further comprising:
a first splitter to split a first source beam to form the first and second measuring beams.

18. The apparatus according to claim 17, further comprising:
a second splitter to split a second source beam to form the third and fourth measuring beams.

19. The apparatus according to claim 16, wherein the first member has a path through which the second measuring beam passes.

20. The apparatus according to claim 16, further comprising:
a fourth reflecting surface located proximate the first side of the first member for reflecting the second beam; and
a fifth reflecting surface located proximate to the first side of the first member for reflecting the second beam between the fourth reflecting surface and the second reflecting surface.

21. The apparatus according to claim 16, further comprising:
a source to provide a source beam;
a first beam splitter to split the source beam into first and second initial beams;
a second beam splitter to split the first initial beam into the first and second measuring beams; and
a third beam splitter to split the second initial beam into the third and fourth measuring beams.

22. The apparatus according to claim 16, further comprising:
a lens through which the second beam is passed.

23. A lithography system comprising the apparatus of claim 16.

24. The apparatus according to claim 1, wherein the second side is located opposite to the first side.

25. The apparatus according to claim 4, wherein the path is a tunnel in the first member.

26. The apparatus according to claim 12, wherein the path is a tunnel in the first member.

27. The apparatus according to claim 16, wherein the second side is located opposite to the first side.

28. The apparatus according to claim 19, wherein the path is a tunnel in the first member.

* * * * *